(12) United States Patent
Face et al.

(10) Patent No.: US 6,812,594 B2
(45) Date of Patent: *Nov. 2, 2004

(54) SELF-POWERED TRAINABLE SWITCHING NETWORK

(75) Inventors: Bradbury R. Face, Norfolk, VA (US); Clark Davis Boyd, Radford, VA (US)

(73) Assignee: Face International Corp., Norfolk, VA (US)

( * ) Notice: Subject to any disclaimer, the term of this patent is extended or adjusted under 35 U.S.C. 154(b) by 44 days.

This patent is subject to a terminal disclaimer.

(21) Appl. No.: 09/990,617

(22) Filed: Nov. 21, 2001

(65) Prior Publication Data

US 2004/0174073 A9 Sep. 9, 2004

(51) Int. Cl.[7] .............................................. H01H 57/00
(52) U.S. Cl. ...................................... 307/119; 200/181
(58) Field of Search .............................. 307/116, 119, 307/125, 143, 139; 200/181; 340/665; 341/22, 176, 825.69; 310/311, 314, 388; 367/157, 166

(56) References Cited

U.S. PATENT DOCUMENTS

| | | | | |
|---|---|---|---|---|
| 5,471,721 A | * | 12/1995 | Haertling | 29/25.35 |
| 5,632,841 A | * | 5/1997 | Hellbaum et al. | 156/245 |
| 5,639,850 A | * | 6/1997 | Bryant | 528/353 |
| 6,630,894 B1 | * | 10/2003 | Boyd et al. | 341/22 |
| 2003/0094856 A1 | * | 5/2003 | Face et al. | 307/116 |

* cited by examiner

*Primary Examiner*—Gregory J. Toatley, Jr.
(74) *Attorney, Agent, or Firm*—David J. Bolduc; Stephen E. Clark

(57) ABSTRACT

A self-powered switching device using a prestressed flextensional electroactive member generates a signal for activation of a latching relay. The electroactive member has a piezoelectric element with a convex and a concave face that may be compressed to generate an electrical pulse. The flextensional electroactive member and associated signal generation circuitry can be hardwired directly to the latching relay or may be coupled to a transmitter for sending an RF signal to a receiver which actuates the latching relay.

17 Claims, 7 Drawing Sheets

SELF-POWERED TRAINABLE SWITCHING NETWORK

BACKGROUND OF THE INVENTION

1. Field of the Invention

The present invention relates generally to switching devices for energizing lights, appliances and the like. More particularly, the present invention relates to a self-powered switch initiator device to generate an activation signal for the latching relay. The power is generated through a piezo-electric element or through relative motion between a magnet and a series of coils. The power is sent through signal generation circuitry coupled to a transmitter for sending a unique coded RF signal to one or more receivers that actuate the latching relay. The receivers are trainable and can respond to multiple transmitters so as to turn on the building's lighting or appliance systems.

2. Description of the Prior Art

Switches and latching relays for energizing lights, appliances and the like are well known in the prior art. Typical light switches comprise, for example, single-pole switches and three-way switches. A single-pole switch has two terminals that are hot leads for an incoming line (power source) and an outgoing line to the light. Three-way switches can control one light from two different places. Each three-way switch has three terminals: the common terminal and two traveler terminals. A typical pair of three-way switches uses two boxes each having two cables with the first box having an incoming line from a power source and an outbound line to the second box, and the second box having the incoming line from the first box and an outbound line to the light.

In each of these switching schemes it is necessary drill holes and mount switches and junction boxes for the outlets as well as running cable. Drilling holes and mounting switches and junction boxes can be difficult and time consuming. Also, running electrical cable requires starting at a fixture, pulling cable through holes in the framing to each fixture in the circuit, and continuing all the way back to the service panel. Though simple in theory, getting cable to cooperate can be difficult and time consuming. Cable often kinks, tangles or binds while pulling, and needs to be straightened out somewhere along the run.

Remotely actuated switches/relays are also known in the art. Known remote actuation controllers include tabletop controllers, wireless remotes, timers, motion detectors, voice activated controllers, and computers and related software. For example, remote actuation means may include modules that are plugged into a wall outlet and into which a power cord for a device may be plugged. The device can then be turned on and off by a controller. Other remote actuation means include screw-in lamp modules wherein the module is screwed into a light socket, and then a bulb screwed into the module. The light can be turned on and off and can be dimmed or brightened by a controller.

An example of a typical remote controller for the above described modules is a radio frequency (RF) base transceiver. With these controllers, a base is plugged into an outlet and can control groups of modules in conjunction with a hand held wireless RF remote. RF repeaters may be used to boost the range of compatible wireless remotes, switches and security system sensors by up to 150 ft. per repeater. The base is required for all wireless RF remotes and allows control of several lamps or appliances. Batteries are also required in the hand held wireless remote.

Rather than using a hand held RF remote, remote wall switches may be used. These wall switches, which are up to ¾" thick, are affixed to a desired location with an adhesive. In conjunction with a base unit (plugged into a 110V receptacle) the remote wall switch may control compatible modules or switches (receivers). The wireless switches send an RF signal to the base unit and the base unit then transmits a signal along the existing 110V wiring in the home to compatible switches or modules. Each switch can be set with an addressable signal. Wireless switches also require batteries.

These remotes control devices may also control, for example, audio/video devices such as the TV, VCR, and stereo system, as well as lights and other devices using an RF to infrared (IR) base. The RF remote can control audio/video devices by sending proprietary RF commands to a converter that translates the commands to IR. IR commands are then sent to the audio/video equipment. The console responds to infrared signals from the infrared remotes and then transmits equivalent commands to compatible receivers.

A problem with conventional wall switches is that extensive wiring must be run both from the switch boxes to the lights and from the switch boxes to the power source in the service panels.

Another problem with conventional wall switches is that additional wiring must be run for lights controlled by more than one switch.

Another problem with conventional wall switches is that the high voltage lines are present as an input to and an output from the switch.

Another problem with conventional wall switches is the cost associated with initial installation of wire to, from and between switches.

Another problem with conventional wall switches is the cost and inconvenience associated with remodeling, relocating or rewiring existing switches.

A problem with conventional RF switches is that they still require an external power source such as high voltage AC power or batteries.

Another problem with conventional RF switches is the cost and inconvenience associated with replacement of batteries.

Another problem with conventional RF switches is that they require high power to individual modules and base units.

Another problem with conventional AC-powered RF switches is the difficulty when remodeling in rewiring or relocating a wall switch.

Another problem with conventional RF switches is that a pair comprising a transmitter and receiver must generally be purchased together.

Another problem with conventional RF switches is that transmitters may inadvertently activate incorrect receivers.

Another problem with conventional RF switches is that receivers may accept an activation signal from only one transmitter.

Another problem with conventional RF switches is that transmitters may activate only one receiver.

Accordingly, it would be desirable to provide a network of switching and/or latching relay devices that overcomes the aforementioned problems of the prior art.

SUMMARY OF THE INVENTION

The present invention provides a self-powered switching or latching relay device using an electroactive or electromagnetic actuator. The piezoelectric element in the electroactive actuator is capable of deforming with a high amount of axial displacement, and when deformed by a mechanical impulse generates an electric field. In an electromagnetic device, the relative motion between a magnet and a series of coils develops the electrical signal. The electroactive or electromagnetic actuators are used as electromechanical generators for generating a momentary signal that actuates a latching/relay mechanism. The latching or relay mechanism thereby turns electrical devices such as lights and appliances on and off or provides an intermediate or dimming signal.

The mechanical actuating means for the electroactive actuator element should apply pressure to the electroactive actuator element with sufficient force/acceleration to generate an electrical pulse of sufficient magnitude and duration. A switch similar to a light switch, for example, may apply pressure through a toggle, snap action or roller mechanism. Larger or multiple electroactive actuator elements may also be used to generate pulses.

In one embodiment, the electroactive actuator is depressed by the manual or mechanical actuating means and the electrical signal generated by the electroactive actuator is applied directly to a relay switch. In another embodiment of the invention, circuitry is installed to modify the electrical pulse generated by the electromagnetic or electroactive actuator. In yet another embodiment, the electromagnetic or electroactive actuator signal powers an RF transmitter which sends an RF signal to an RF receiver which then actuates the relay. In yet another embodiment, the electromagnetic or electroactive actuator signal powers a transmitter, which sends a pulsed RF signal to an RF receiver which then actuates the relay. Digitized RF signals may be coded (as with a garage door opener) to only activate the relay that is coded with that digitized RF signal. The transmitters may be capable of developing one or more coded RF signals and the receivers likewise may be capable of receiving one or more coded RF signal. Furthermore, the receivers may be "trainable" to accept coded RF signals from new or multiple transmitters.

Accordingly, it is a primary object of the present invention to provide a switching or relay device in which an electroactive or piezoelectric element is used to activate the device.

It is another object of the present invention to provide a switching or relay device in which an electromagnetic element is used to activate the device.

It is another object of the present invention to provide a device of the character described in which switches may be installed without necessitating additional wiring.

It is another object of the present invention to provide a device of the character described in which switches may be installed without cutting holes into the building structure.

It is another object of the present invention to provide a device of the character described in which switches do not require external electrical input such as 120 or 220 VAC or batteries.

It is another object of the present invention to provide a device of the character described incorporating an electroactive or electromagnetic device that generates an electrical signal of sufficient magnitude to activate a latching relay.

It is another object of the present invention to provide a device of the character described incorporating an electroactive or electromagnetic device that generates an electrical signal of sufficient magnitude to activate a radio frequency transmitter for activating a latching relay.

It is another object of the present invention to provide a device of the character described incorporating an electromagnetic actuator that generates an electrical signal of sufficient magnitude to activate a radio frequency transmitter for activating a latching relay.

It is another object of the present invention to provide a device of the character described incorporating a transmitter that is capable of developing at least one coded RF signal.

It is another object of the present invention to provide a device of the character described incorporating a receiver capable of receiving at least one coded RF signal from at least one transmitter.

It is another object of the present invention to provide a device of the character described incorporating a receiver capable of "learning" to accept coded RF signals from one or more transmitters.

It is another object of the present invention to provide a device of the character described for use in actuating lighting, appliances, security devices and other fixtures in a building.

Further objects and advantages of the invention will become apparent from a consideration of the drawings and ensuing description thereof.

DESCRIPTION OF THE PREFERRED EMBODIMENT

Electroactive Actuator

Figure 1:
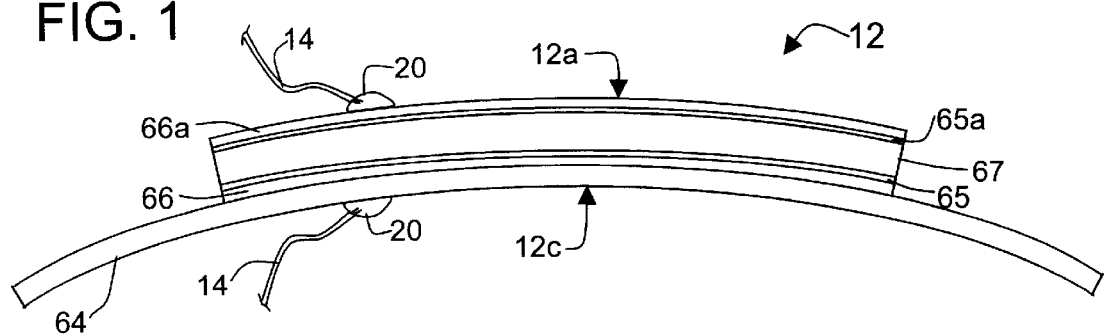
FIG. 1 is an elevation view showing the details of construction of a flextensional piezoelectric actuator used in the present invention.

Piezoelectric and electrostrictive materials (generally called "electroactive" devices herein) develop a polarized electric field when placed under stress or strain. The electric field developed by a piezoelectric or electrostrictive material is a function of the applied force causing the mechanical stress or strain. Conversely, electroactive devices undergo dimensional changes in an applied electric field. The dimensional change (i.e., expansion or contraction) of an electroactive device is a function of the applied electric field. Electroactive devices are commonly used as drivers, or "actuators" due to their propensity to deform under such electric fields. These electroactive devices or actuators also have varying capacities to generate an electric field in response to a deformation caused by an applied force.

Existing electroactive devices include direct and indirect mode actuators, which typically make use of a change in the dimensions of the material to achieve a displacement, but in the present invention are preferably used as electromechanical generators. Direct mode actuators typically include a piezoelectric or electrostrictive ceramic plate (or stack of plates) sandwiched between a pair of electrodes formed on its major surfaces. The devices generally have a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent. Conversely, direct mode generator-actuators require application of a high amount of force to piezoelectrically generate a pulsed momentary electrical signal of sufficient magnitude to activate a latching relay.

Indirect mode actuators are known in the prior art to exhibit greater displacement and strain than is achievable with direct mode actuators by achieving strain amplification via external structures. An example of an indirect mode actuator is a flextensional transducer. Flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater strain and displacement than can be produced by direct mode actuators.

The magnitude of achievable strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10%. A conventional bimorph device includes an intermediate flexible metal foil sandwiched between two piezoelectric elements. Electrodes are bonded to each of the major surface of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20%.

For certain applications of electroactive actuators known in the prior art, asymmetrically stress biased electroactive devices have been proposed in order to increase the axial deformation of the electroactive material, and therefore increase the achievable strain of the electroactive material. In such devices, (which include, for example, "Rainbow" actuators (as disclosed in U.S. Pat. No. 5,471,721), and other flextensional actuators) the asymmetric stress biasing produces a curved structure, typically having two major surfaces, one of which is concave and the other which is convex.

Referring to FIG. 1: A unimorph actuator called "THUNDER", which has improved displacement, strain and load capabilities, has recently been developed and is disclosed in U.S. Pat. No. 5,632,841. THUNDER (which is an acronym for THin layer composite UNimorph ferroelectric Driver and sEnsoR), is a unimorph actuator in which a pre-stress layer is bonded to a thin piezoelectric ceramic wafer at high temperature, and during the cooling down of the composite structure asymmetrically stress biases the ceramic wafer due to the difference in thermal contraction rates of the pre-stress layer and the ceramic layer.

The THUNDER actuator 12 is as a composite structure, the construction of which is illustrated in FIG. 1. Each THUNDER actuator 12 is constructed with an electroactive member preferably comprising a piezoelectric ceramic layer 67 of PZT which is electroplated 65 and 65a on its two opposing faces. A pre-stress layer 64, preferably comprising steel, stainless steel, beryllium alloy or other metal substrate, is adhered to the electroplated 65 surface on one side of the ceramic layer 67 by a first adhesive layer 66. In the simplest embodiment, the adhesive layer 66 acts as a prestress layer. The first adhesive layer 66 is preferably LaRC™-SI material, as developed by NASA-Langley Research Center and disclosed in U.S. Pat. No. 5,639,850. A second adhesive layer 66a, also preferably comprising LaRC-SI material, is adhered to the opposite side of the ceramic layer 67. During manufacture of the THUNDER actuator 12 the ceramic layer 67, the adhesive layer 66 and the pre-stress layer 64 are simultaneously heated to a temperature above the melting point of the adhesive material. In practice the various layers composing the THUNDER actuator (namely the ceramic layer 67, the adhesive layers 66 and 66a and the pre-stress layer 64) are typically placed inside of an autoclave or a convection oven as a composite structure, and slowly heated by convection until all the layers of the structure reach a temperature which is above the melting point of the adhesive 66 material but below the Curie temperature of the ceramic layer 67. It is desirable to keep the temperature of the ceramic layer 67 beneath the Curie temperature of the ceramic layer in order to avoid disrupting the piezoelectric characteristics of the ceramic layer 67. Because the multi-layer structure is typically convectively heated at a slow rate, all of the layers tend to be at approximately the same temperature. In any event, because an adhesive layer 66 is typically located between two other layers (i.e. between the ceramic layer 67 and the pre 18 stress layer 64), the ceramic layer 67 and the pre-stress layer 64 are usually very close to the same temperature and are at least as hot as the adhesive layers 66 and 66a during the heating step of the process. The THUNDER actuator 12 is then allowed to cool.

Figure 2:
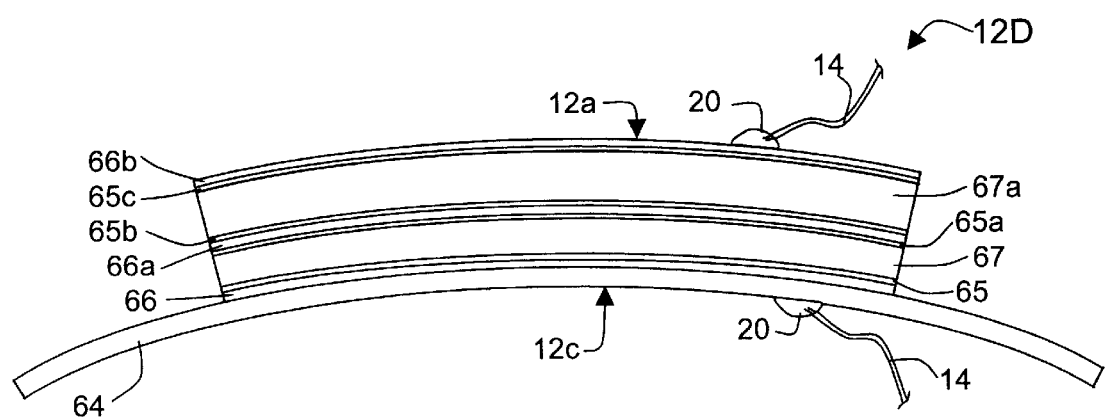
FIG. 2 is an elevation view showing the details of construction of an alternate multi-layer flextensional piezoelectric actuator used in a modification the present invention.

During the cooling step of the process (i.e. after the adhesive layers 66 and 66a have re-solidified) the ceramic layer 67 becomes compressively stressed by the adhesive layers 66 and 66a and pre-stress layer 64 due to the higher coefficient of thermal contraction of the materials of the adhesive layers 66 and 66a and the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a) on the other side of the ceramic layer 67, the ceramic layer deforms in an arcuate shape having a normally convex face 12a and a normally concave face 12c, as illustrated in FIGS. 1 and 2. One or more additional pre-stressing layer(s) may be similarly adhered to either or both sides of the ceramic layer 67 in order, for example, to increase the stress in the ceramic layer 67 or to strengthen the actuator 12. Furthermore, the substrate comprising a separate prestress layer 64 may be eliminated and the adhesive layer 66 may apply the prestress to the ceramic layer 067. Alternatively, only the prestress layer(s) 64 and the adhesive layer(s) 66 may be heated and bonded to a ceramic layer 67, while the ceramic layer 67 is at a lower temperature, in order to induce greater compressive stress into the ceramic layer 67 when cooling the actuator 12.

Referring now to FIG. 2: An alternate actuator 12D may include a composite piezoelectric ceramic layer that comprises multiple thin layers 67 and 67a of PZT which are bonded to each other. Each layer 67 and 67a comprises a thin layer of piezoelectric material, with a thickness preferably on the order of about 1 mil. Each thin layer 67 and 67a is electroplated 65 and 65a, and 65b and 65c on each major face respectively. The individual layers 67 and 67a are then bonded to each other with an adhesive layer 66a, using an adhesive such as LaRC-SI. Alternatively, and most preferably, the thin layers 67 and 67a may be bonded to each other by cofiring the thin sheets of piezoelectric material together. As few as two layers, but preferably at least four sheets of piezoelectric material may be bonded/cofired together. The composite piezoelectric ceramic layer may then be bonded to prestress layer(s) 64 with the adhesive layer(s) 66 and 66b, and heated and cooled as described above to make a modified THUNDER actuator 12D. By having multiple thinner layers 67 and 67a of piezoelectric material in a modified actuator 12D, the composite ceramic layer generates a lower voltage and higher current as compared to the high voltage and low current generated by a THUNDER actuator 12 having only a single thicker ceramic layer 67.

A flexible insulator may be used to coat the convex face 12a of the actuator 12. This insulative coating helps prevent unintentional discharge of the piezoelectric element through inadvertent contact with another conductor, liquid or human contact. The coating also makes the ceramic element more durable and resistant to cracking or damage from impact. Since LaRC-SI is a dielectric, the adhesive layer 67a on the convex face 12a of the actuator 12 may act as the insulative layer. Alternately, the insulative layer may comprise a plastic, TEFLON or other durable coating.

Electrical energy may be recovered from or introduced to the actuator element 12 by a pair of electrical wires 14. Each electrical wire 14 is attached at one end to opposite sides of the actuator element 12. The wires 14 may be connected (for example by glue or solder 20) directly to the electroplated 65 and 65a faces of the ceramic layer 67, or they may alternatively be connected to the pre-stress layer(s) 64. As discussed above, the pre-stress layer 64 is preferably adhered to the ceramic layer 67 by LaRC-SI material, which is a dielectric. When the wires 14 are connected to the pre-stress layer(s) 64, it is desirable to roughen a face of the pre-stress layer 64, so that the pre-stress layer 64 intermittently penetrates the respective adhesive layers 66 and 66a, and make electrical contact with the respective electroplated 65 and 65a faces of the ceramic layer 67. The opposite end of each electrical wire 14 is preferably connected to an electric pulse modification circuit 10.

Prestressed flextensional transducers 12 are desirable due to their durability and their relatively large vertical displacement, and concomitant relatively high voltage that such transducers are capable of developing. The present invention however may be practiced with any electroactive element having the properties and characteristics herein described, i.e., the ability to generate a voltage in response to a deformation of the device. For example, the invention may be practiced using magnetostrictive or ferroelectric devices. The transducers also need not be normally arcuate, but may also include transducers that are normally flat, and may further include stacked piezoelectric elements.

Figure 4:
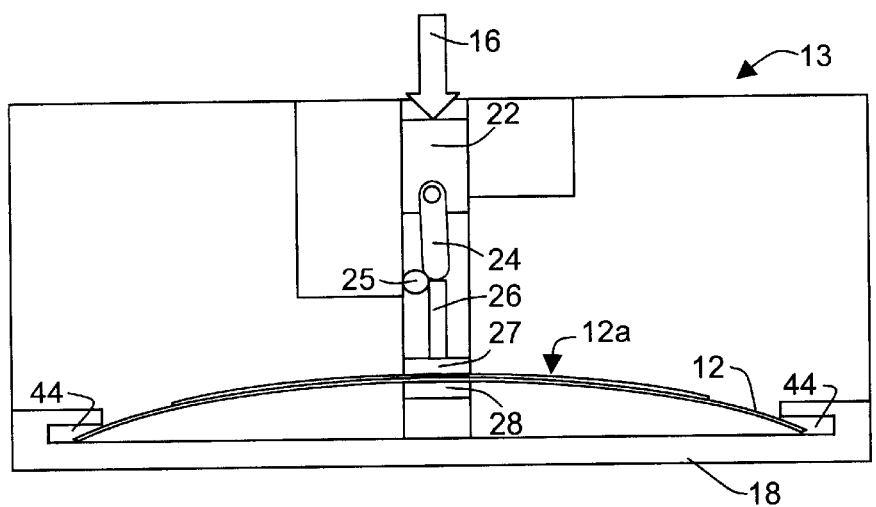
FIG. 4 is an elevation view of the device of FIG. 3 illustrating the deformation of the actuator upon application of a force.

In operation, as shown in FIG. 4, when a force indicated by arrow 16 is applied to the convex face 12a of the actuator 12, the force deforms the piezoelectric element 12. The force may be applied to the piezoelectric actuator 12 by any appropriate means such as by application of manual pressure directly to the piezoelectric actuator, or by other mechanical means. Preferably, the force is applied by a mechanical switch (e.g., a plunger, striker, toggle or roller switch) capable of developing a mechanical impulse for application to and removal from the actuator 12. The mechanical impulse (or removal thereof) should be of sufficient force to cause the convex face 12a of the actuator 12 to deform quickly and accelerate over a distance (approximately 10 mm) which generates an electrical signal of sufficient magnitude to activate an electromechanical latching relay.

Figure 3:
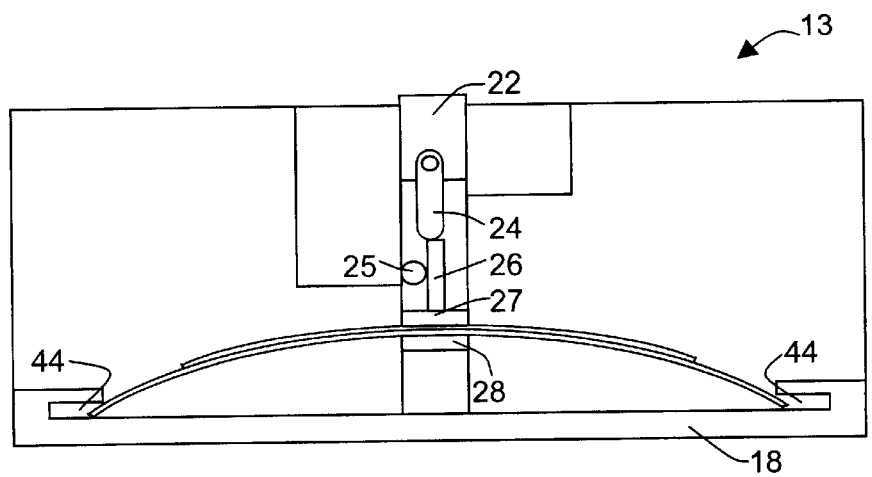
FIG. 3 is an elevation view of a device for mechanical application and removal of a force to an actuator.
Figure 5:
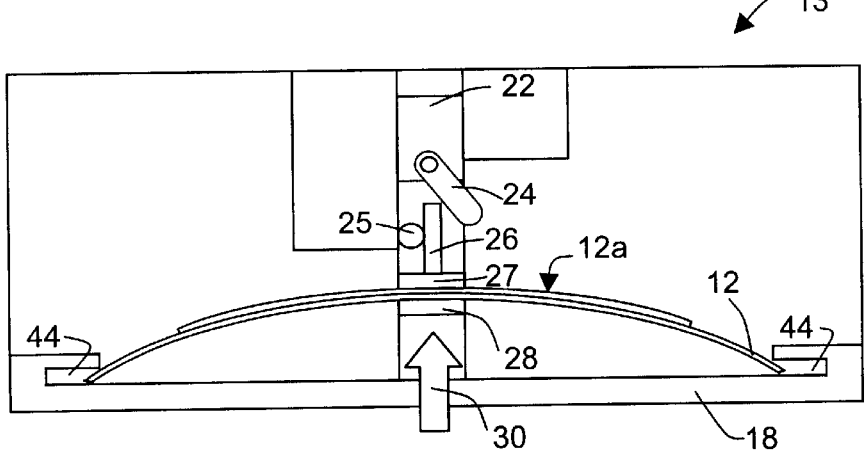
FIG. 5 is an elevation view of the device of FIG. 3 illustrating the recovery of the actuator upon removal of the force by tripping of a quick-release device.

Referring to FIGS. 3, 4 and 5: An illustration of a suitable means for application of mechanical force comprises a switch plate and a plunger assembly 13. The two ends of the piezoelectric actuator are each pivotably held in place within a recess 44 of a switch plate 18. The switch plate 18 is the same shape as the actuator 12 contained therein, preferably rectangular. In an alternate embodiment, a circular actuator may be mounted in a circular recess of a circular switch plate. The recess(es) 44 in the switch plate 18 hold the actuator 12 in place in its relaxed, i.e., undeformed state. The recesses 44 are also sufficiently deep to fully receive the ends or edges of the actuator 12 in its fully deformed, i.e., flat state. The plunger assembly comprises a push button 22 pivotably connected to a hinged quick-release mechanism 24. The opposite end of the quick-release mechanism 24 contacts shaft 26 connected to a pair of plates 27 and 28 which are clamped on both sides of the actuator 12. A release cog 25 is located along the path of the quick-release mechanism 24.

Referring to FIGS. 4 and 5: In operation, when the push button 22 is depressed in the direction of arrow 16, the quick-release mechanism 24 pushes down on the shaft 26 and plates 27 and 28 and deforms the actuator 12. When the quick-release mechanism 24 reaches the release cog 25, the quick-release mechanism 24 pivots on its hinge and releases the downward pressure from the shaft 26, plates 27 and 28 and actuator 12. The actuator 12, on account of the restoring force of the substrate of the prestress layer 64, returns quickly to its undeformed state in the direction of arrow 30 as in FIG. 5. Other means by which a force may be applied to and/or released from the actuator include twisting of door knob, opening a door that places pressure on an actuator in the jamb, stepping onto the actuator on the ground, floor or in a mat, or even sitting down.

As previously mentioned, the applied force causes the piezoelectric actuator to deform. By virtue of the piezoelectric effect, the deformation of the piezoelectric element 12 generates an instantaneous voltage between the faces 12a and 12c of the actuator 12, which produces a pulse of electrical energy. Furthermore, when the force is removed from the piezoelectric actuator 12, the actuator recovers its original arcuate shape. This is because the substrate or prestress layer 64 to which the ceramic 67 is bonded exerts a compressive force on the ceramic 67, and the actuator 12 thus has a coefficient of elasticity that causes the actuator 12 to return to its undeformed neutral state. On the recovery stroke of the actuator 12, the ceramic 67 returns to its undeformed state and thereby produces another electrical pulse of opposite polarity. The downward (applied) or upward (recovery) strokes should cause a force over a distance that is of sufficient magnitude to create the desired electrical pulse. The duration of the recovery stroke, and therefore the duration of the pulse produced, is preferably in the range of 50–100 milliseconds, depending on the amount of force applied to the actuator 12.

In the preferred embodiment of the invention, the electrical pulse that is generated upon removal of the force i.e., when the actuator 12 recovers its shape, is the pulse that is used. This is because the downward force applied, by hand for example, may be inconsistent, whereas the recovery force of the actuator is a more predictable and consistent force. Furthermore, because the second pulse has an opposite polarity to the first pulse, rapid application of the first and second pulse may cause an attached relay to simply open and close. Electrical filtering components (such as a diode or zero voltage switching circuitry) may be used to isolate the relay from the first pulse in order to only use the second pulse.

Electromagnetic Actuator

Figure 10:
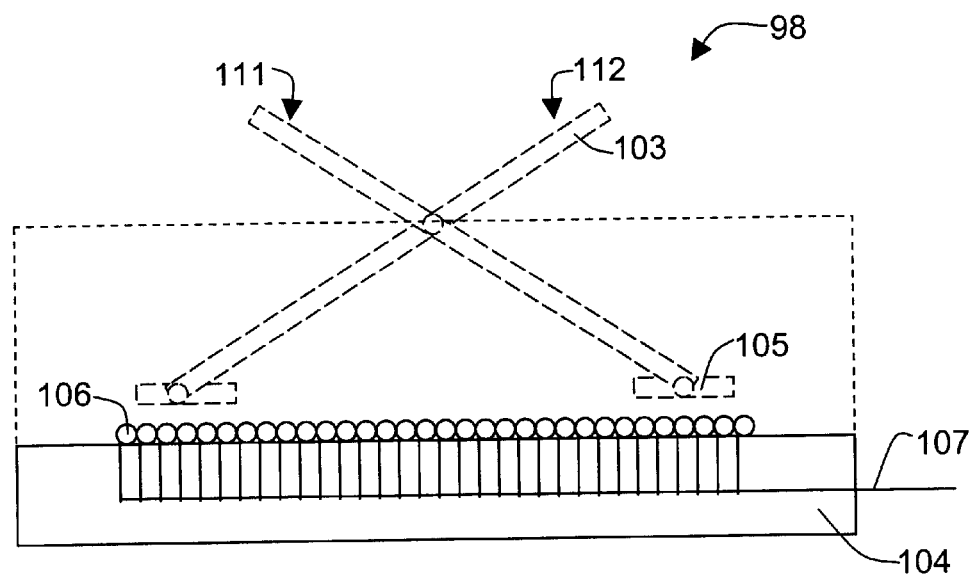
FIG. 10 is a schematic view of a linear electromagnetic actuator for generation of an electrical signal in the present invention.
Figure 11:
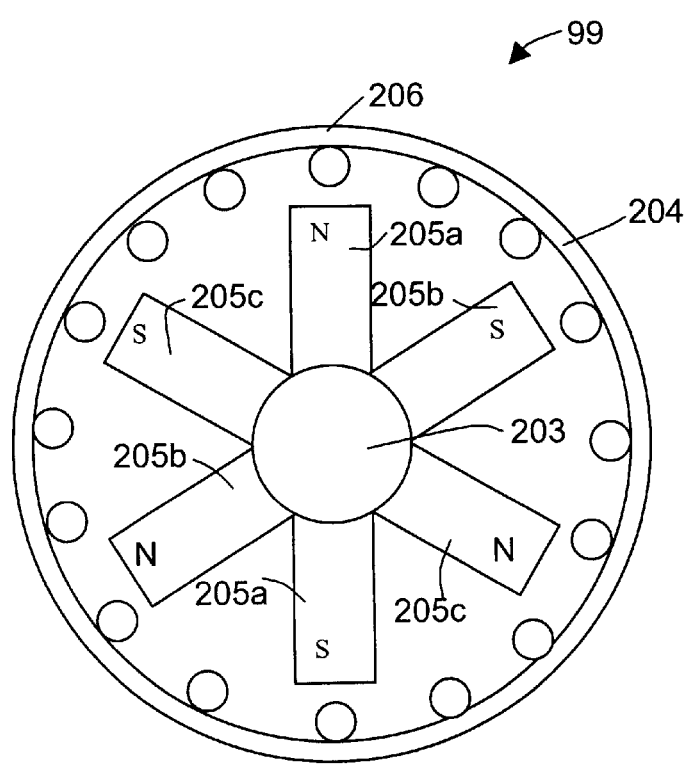
FIG. 11 is a is a schematic view of a rotary electromagnetic actuator for generation of an electrical signal in the present invention.

Referring now to FIGS. 10 and 11: In another embodiment of the invention the actuation means for generating the electrical signal comprises a magnet and a series of coils, which generate an electrical signal in response to relative motion between the magnet and the coils.

Referring to FIGS. 10 and 11: In the preferred embodiments of the electromagnetic actuator 98 or 99, mechanical or manual actuation means, such as a linear switch 103 or rotary switch 203 is coupled to one or more magnets 105 or 205a–c respectively, and more preferably a rare earth magnet. Rare earth magnets are preferred because they have higher magnetic fields than typical permanent magnets. A small rare earth magnet may be used so that the electromagnetic actuator may be made more compact.

The electromagnetic actuator 98 or 99 also comprises a series of wire coils 106 or 206. More specifically, for a magnet 105 coupled to a linear switch 103, a series of small wire coils 106 are arranged along a substrate 104 in close proximity to and substantially parallel to the longitudinal axis along which the rare earth magnet 105 moves in response to actuation of the linear switch 103.

Alternately, the coils comprise a series of coils 206 arranged on the interior of a circular substrate 204, i.e., around a central axis about which the magnets 205a, 205b and 205c rotates in response to actuation of a rotary switch 203. There may be as few as one coil, but preferably at least three coils are located along the axis relative to which the magnet moves. More specifically, 6 or more coils are preferably evenly spaced along the axis of motion of the magnet, which for a linear actuator 98 is at least three times the length of the magnet.

In operation, when the manual or mechanical actuation of the linear switch 103, the attached magnet 105 moves along longitudinal axis from position 111 to position 112. As the magnet 105 passes a coil 106, the changing magnetic field creates an electric field in the coil 106. The current flows from ground (not shown) through the coil 106 and into a wire 107 connected to a conductor 14. This happens at each coil 106 so that as the magnet 105 passes the series of coils 106 an electric field is generated in each coil 106 and is summed at conductor 14. In a like manner, when the rotary switch 203 in the embodiment of FIG. 11 is rotated, the magnet(s) 205a–c move in relation to the coils 206 attached to the periphery of the casing 204 of the electromagnetic motor 99, and generate an electric field in a like manner.

Figure 6:
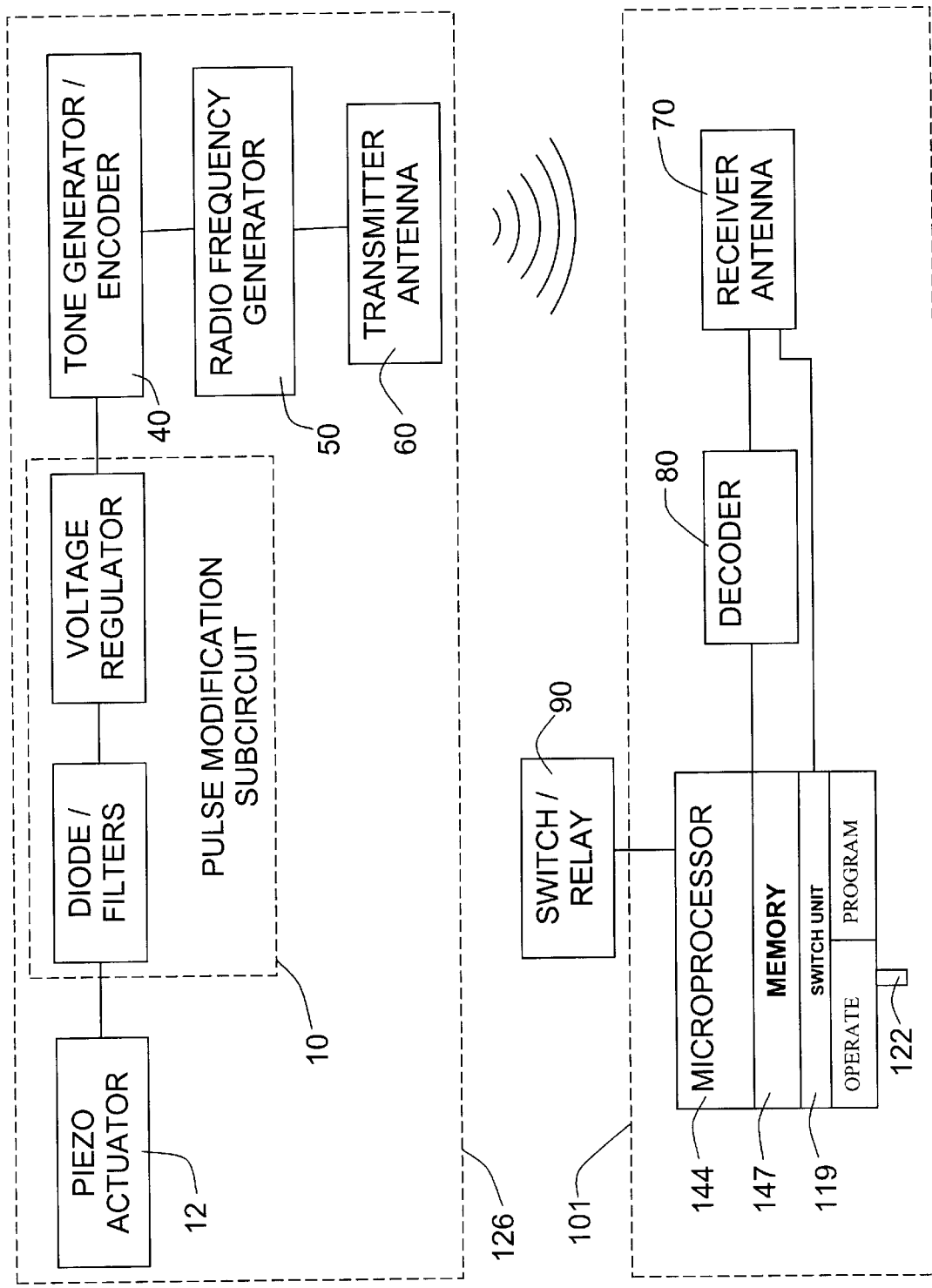
FIG. 6 is a schematic showing the switching device of the present invention incorporating flextensional piezoelectric actuator.
Figure 7:
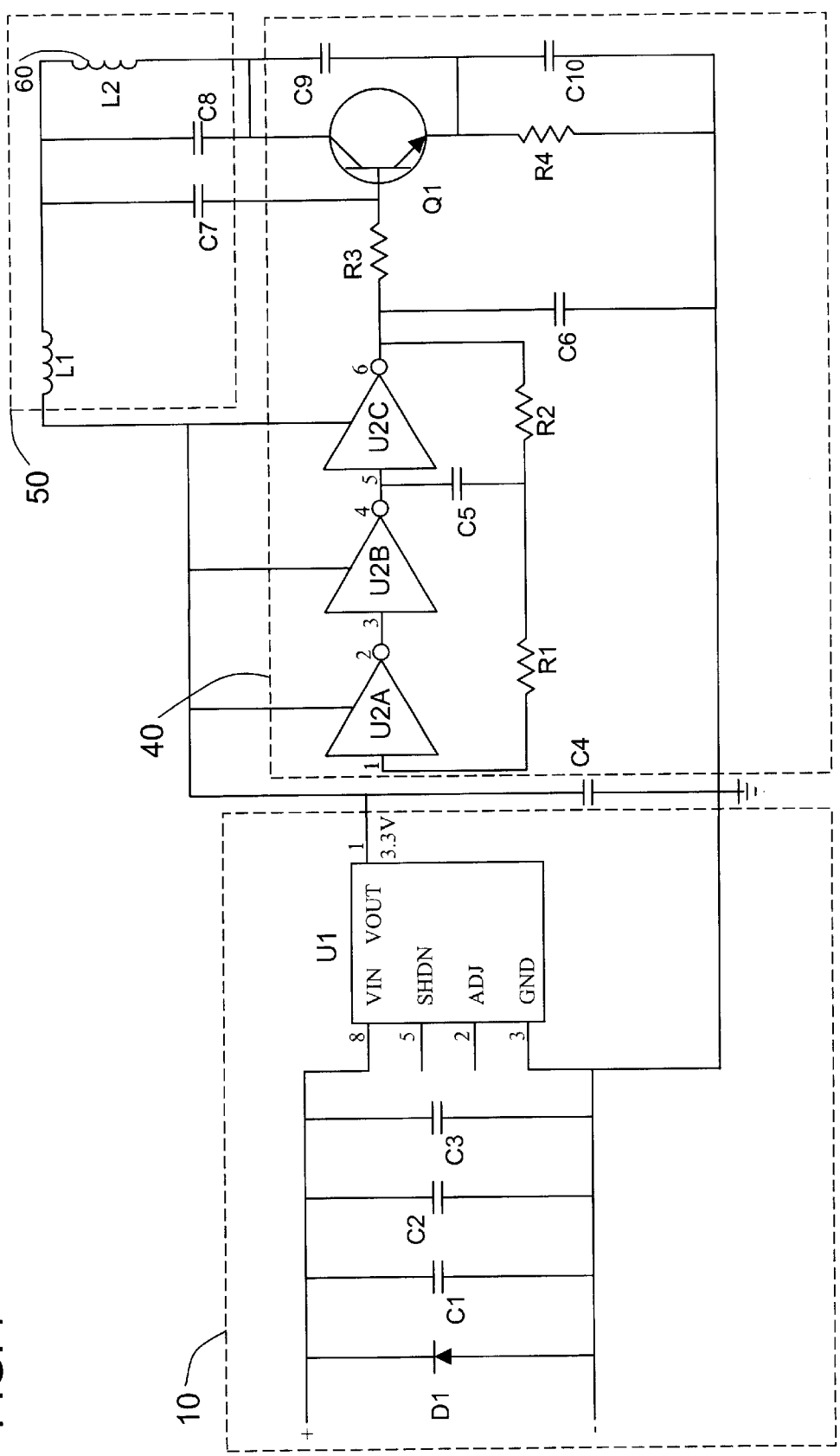
FIG. 7 is a detailed schematic showing the pulse modification, tone generator and RF generator subcircuit portions of FIG. 6.

Referring to FIGS. 6 and 7: The pulse of electrical energy is transmitted from the actuator 12, 98 or 99 via the electrical wires 14 connected to each of the actuator 12 to a switch or relay 90. The pulse of electrical energy is of sufficient magnitude to cause the switch/relay 90 to toggle from one position to another. Alternatively and preferably, the electrical pulse is first transmitted through a pulse modification circuit 10 in order to modify the character, i.e, current, voltage, frequency and/or pulse width of the electrical signal.

Referring now to FIG. 7: The electrical pulse modification circuit 10 essentially comprises a diode-capacitor array and a voltage regulator U1. The anode and cathode of the diode D1 are connected to each wire 14 respectively. More specifically, the anode is connected via a first wire 14 to the convex face 12a of the actuator 12, and the cathode is connected via the other wire to the concave face 12c of the actuator 12. This connection allows only the voltage pulse generated on the recovery stroke of the actuator 12 to be transmitted past the diode D1.

The pulse modification circuit 10 also comprises a voltage regulator U1, which controls the input electrical pulse downstream of the diode D1. The output signal of voltage regulator U1 is preferably 3.3 volts DC. One or more capacitors C1, C2 and C3 may be provided between the diode D1 and the voltage regulator U1. The capacitors C1, C2 and C3 are connected in parallel with the diode D1. The capacitors C1, C2 and C3 act as filters to provide a more uniform voltage input to the voltage regulator U1. The capacitors C1, C2 and C3 also prevent excessive peak voltages from affecting downstream components of the circuit (such as the voltage regulator U1). The output of the voltage regulator is a pulse of uniform voltage with a duration of approximately 50–100 milliseconds depending on the load applied to the actuator 12. The output voltage signal of the pulse modification circuit 10 may then be transmitted via another wire to the relay switch 90, in order to change the position of the relay switch 90 from one position to another.

Figure 12:
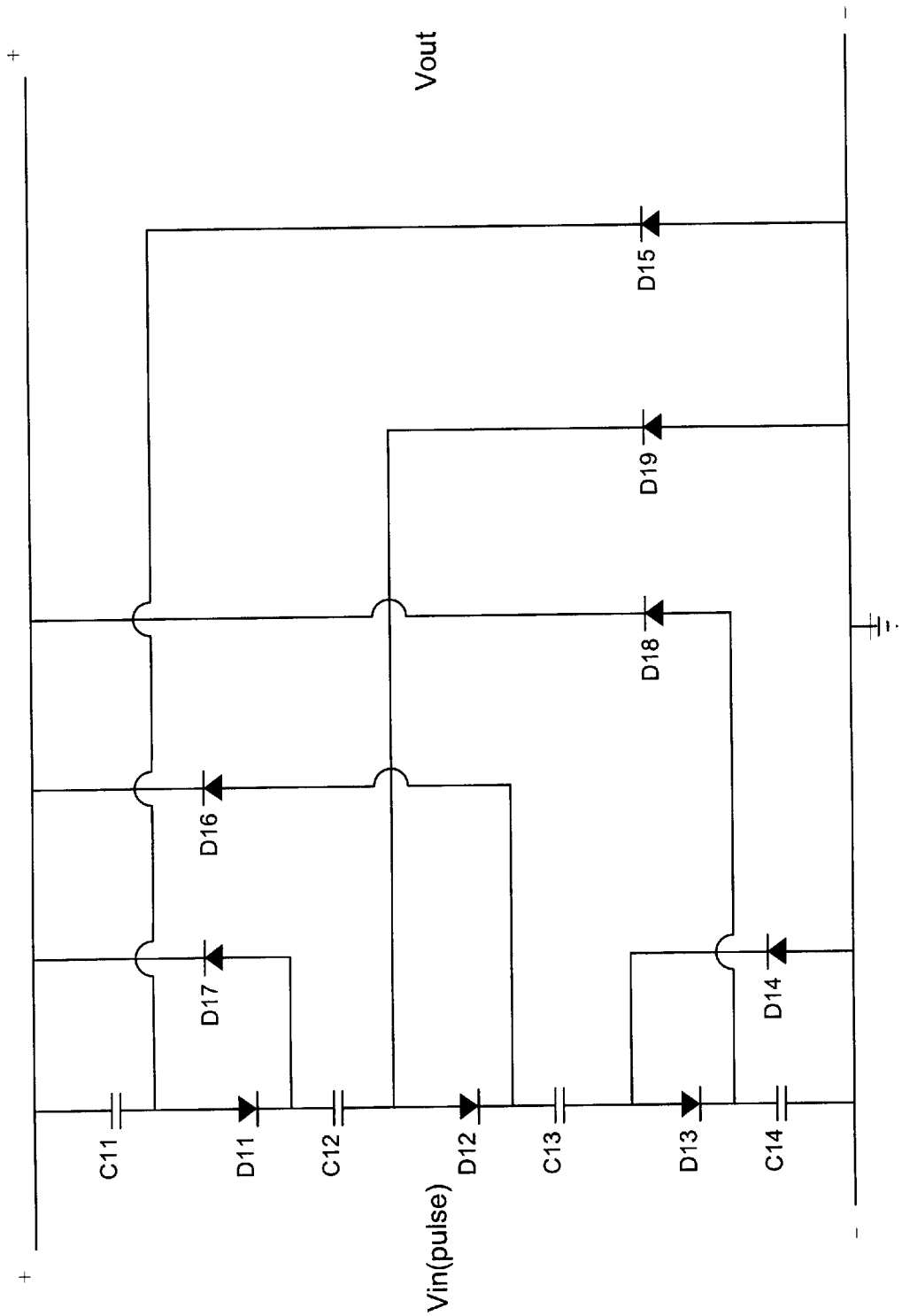
FIG. 12 is a partial schematic of a voltage regulation subcircuit for use in an alternate embodiment of the invention.

Referring to FIG. 12: An alternate pulse modification circuit contains a capacitor-diode array that operates in a different manner. More specifically, the alternate capacitor-diode array preferably has four capacitors C11, C12, C13 and C14 and nine diodes D11–D19 connected between the positive and negative terminals of the actuator. More specifically, the four capacitors C11, C12, C13 and C14 and three diodes D11, D12 and D13 are connected in series across the output of the actuator, in an alternating fashion, i.e., the capacitors and diodes are connected with C11, D11, C12, D12, C13, D13 and C14 in series in that order. Each of the capacitors C11, C12, C13 and C14 preferably has the same value, and each of the diodes D11, D12 and D13 preferably has the same value. Each of the diodes D11, D12 and D13 are preferably connected to each other anode to cathode, with the cathode of diode D13 connected to the ground terminal of the actuator and the anode of diode D11 connected to the positive terminal of the actuator.

Each junction between a capacitor C11, C12, C13 and C14 and a diode D11, D12 and D13 is connected through another diode either to ground or the positive terminal of the actuator. More specifically, the junctions of the capacitors C11, C12, C13 and C14 with the cathodes of the series diodes D11, D12 and D13 is connected through the anode of another diode D16, D17 and D18 to the positive terminal of the actuator. Also, the junctions of the capacitors C11, C12, C13 and C14 with the anodes of the series diodes D11, D12 and D13 is connected through the cathode of another diode D14, D15 and D19 to the negative or ground terminal of the actuator. Thus, the first series diode D11 has its anode connected through C1 to the positive terminal of the actuator and through the cathode of diode D19 to the negative terminal of the actuator, and also has its cathode connected though the anode of diode D17 to the positive terminal of the actuator. Likewise, the second series diode D12 has its anode connected through C2, D1 and C1 to the positive terminal of the actuator and through the cathode of diode D15 to the negative terminal of the actuator, and also has its cathode connected though the anode of diode D16 to the positive terminal of the actuator. Finally, the third series diode D13 has its anode connected through C3, D2, C2, D1 and C1 to the positive terminal of the actuator and through the cathode of diode D14 to the negative terminal of the actuator, and has its cathode connected though the anode of diode D18 to the positive terminal of the actuator, and also has its cathode connected through C4 to the negative terminal of the actuator.

In operation, the voltage pulse from the actuator charges the series capacitors C11, C12, C13 and C14 through the series diodes D11, D12 and D13. Since the capacitors C11, C12, C13 and C14 preferably are of equal value, each of them carries one quarter of the charge of the voltage pulse. As the pulse subsides to one quarter of its original value, the diodes D17, D16 and D18 connected between each of the series diodes series capacitors C11, C12, C13 and C14 and the positive terminal become positively biased and the capacitors C12, C13 and C14 discharge through them. As the capacitors discharge, the diodes D14, D15 and D19 become positively biased, placing each capacitor in parallel with the output voltage. Thus as the voltage pulse subsides, capacitor C11 is placed in parallel with the output through diode D19, Capacitor C12 through diodes D15 and D15, capacitor C13 through diodes D14 and D16 and capacitor C14 through diode D18.

This modified diode-capacitor array essentially quadruples the amount of energy from the voltage pulse. By splitting the pulse into lower voltages and then adding the current in parallel, the array transforms the pulse into a more useable value, with lower voltage, but higher current and duration, which is desirable in downstream components of the self-powered switching relay.

Referring again to FIGS. 6 and 7: More preferably, the output of the voltage regulator U1 is used to power tone generator or encoder 40 comprising an inverter array U2, which generates a pulsed tone. This pulsed tone modulates an RF generator section 50 which radiates an RF signal using a tuned loop antenna 60. The signal radiated by the loop antenna is intercepted by an RF receiver 70 and a decoder 80 which generates a relay pulse to activate the relay 90.

The output of the voltage regulator U1 is connected to an inverter array U2, which acts as an encoder 40 for the electrical pulse. More specifically, the output conductor for the output voltage pulse (nominally 3.3 volts) is connected to the input pin of a hex inverter array U2. Preferably 3 of the 6 inverters U2A, U2B and U2C in the inverter array U2 are connected in series, and the other inverters (not shown) are not used (grounded). The last inverter U2C is connected in parallel with a series combination of a resistor R2 and a capacitor C5, which determine the oscillation frequency of the inverter array U2. The first two of the series connected inverters U2A and U2B are connected in parallel with a series combination of a resistor R1 and capacitor C5. In operation, capacitor C5 is charged through the first resistor R2. After the capacitor C5 is fully charged, the voltage then follows resistor R1 which triggers each of the inverters U2A, U2B and U2C to toggle in series. This cyclic toggling of the inverters U2A, U2B and U2C generates a square wave output determined by the RC constant of the R2-C5 combination. Connecting the inverters U2A, U2B and U2C in series generates a faster switching signal for the final inverter U2C of the series and thus a clean, abrupt output signal. Thus, the output of the inverter array U2 is a series of square waves oscillating between 0 and a positive voltage, preferably +3.3 VDC, the duration of the series of square waves being determined by the duration of the output voltage pulse of the voltage regulator U1. By choosing an appropriate R-C time constant, one can determine from the duration of the pulse, the desired pulse width and hence, the number of cycles of the square wave. In the preferred embodiment of the invention, R2 has a value of about 1.2 megaohms and the capacitor C5 has a value of 220 picofarads. Alternatively capacitor C5 is tunable in order to adjust the frequency of oscillation of the inverter array U2. These values provide a one millisecond long square wave having a pulse width of one half millisecond which equates to approximately 100 square wave cycles.

The tone generator or encoder 40 may be constructed as an IC and therefore may be miniaturized and also programmed with a variety of values. Thus the encoder 40 is capable of generating one of many unique encoded signals by simply varying the RC constant of the encoder 40. More specifically, the encoder 40 can generate one of a billion or more possible codes. It is also possible and desirable to have more than one encoder 40 included in the circuit in order to generate more than one code from one actuator or transmitter. Alternately, any combination of multiple actuators and multiple pulse modification subcircuits may be used together to generate a variety of unique encoded signals.

The DC output of the voltage regulator U1 and the square wave output of the inverter array U2 are connected to an RF generator 50. The RF generator 50 consists of tank circuit connected to the voltage regulator U1 through both a bipolar transistor (BJT) Q1 and an RF choke. More specifically, the tank circuit consists of a resonant circuit comprising an inductor L2 and a capacitor C8 connected to each other at each of their respective ends (in parallel). Either the capacitor C8 or the inductor L2 or both may be tunable in order to adjust the frequency of the tank circuit. An inductor L1 acts as an RF choke, with one end of the inductor L1 connected to the output of the voltage regulator U1 and the opposite end of the inductor L1 connected to a first junction of the L2-C8 tank circuit. Preferably, the RF choke inductor L1 is an inductor with a diameter of approximately 0.125 inches and turns on the order of thirty and is connected on a loop of the tank circuit inductor L2. The second and opposite junction of the L2-C8 tank circuit is connected to the collector of BJT Q1. The base of the BJT Q1 is also connected through resistor R3 to the output side of the inverter array U2. A capacitor C7 is connected to the base of a BJT Q1 and to the first junction of the tank circuit. Another capacitor C9 is connected in parallel with the collector and emitter of the BJT Q1. This capacitor C9 improves the feedback characteristics of the tank circuit. The emitter of the BJT is connected through resistor R4 to ground. The emitter of the BJT is also connected to ground through capacitor C10 which is in parallel with the resistor R4. The capacitor C10 in parallel with the resistor R4 provides a more stable conduction path from the emitter at high frequencies.

Figure 8:
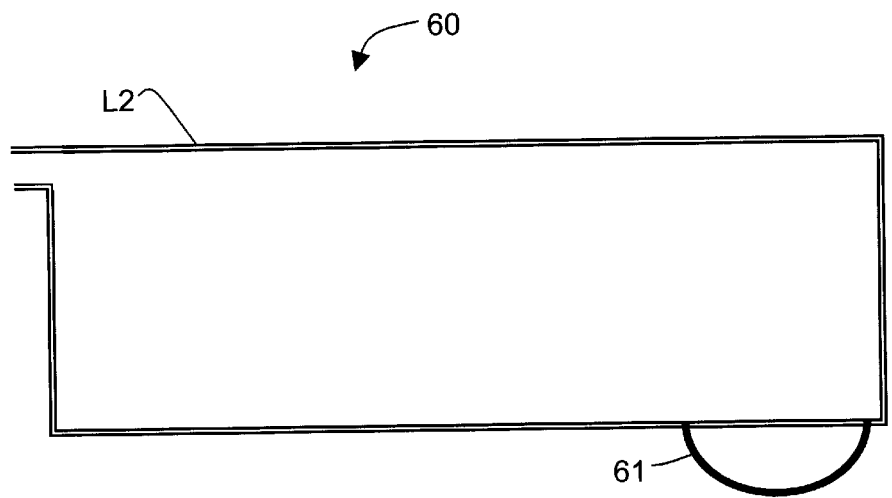
FIG. 8 is a plan view of the tuned loop antenna of FIG. 7 illustrating the jumper at a position maximizing the inductor cross-section.
Figure 9:
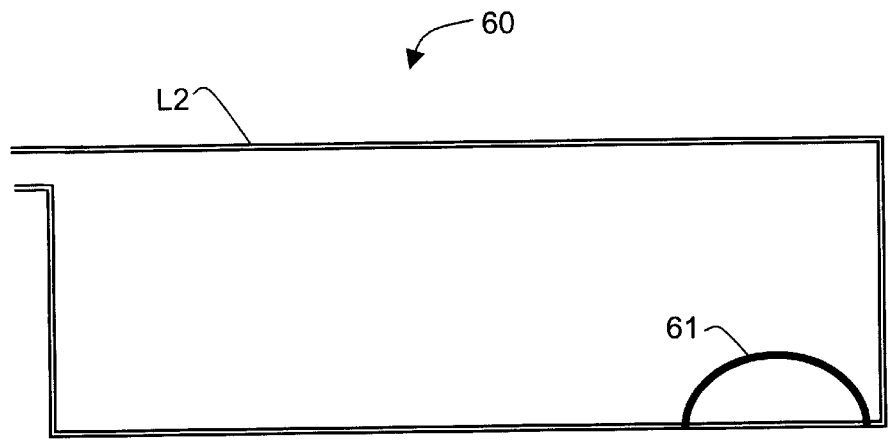
FIG. 9 is a plan view of the tuned loop antenna of FIG. 7 illustrating the jumper at a position minimizing the inductor cross-section.

Referring now to FIGS. 8 and 9: The RF generator 50 works in conjunction with a tuned loop antenna 60. In the preferred embodiment, the inductor L2 of the tank circuit serves as the loop antenna 60. More preferably, the inductor/loop antenna L2 comprises a single rectangular loop of copper wire having an additional smaller loop or jumper 61 connected to the rectangular loop L2. Adjustment of the shape and angle of the smaller loop 61 relative to the rectangular loop L2 is used to increase or decrease the apparent diameter of the inductor L2 and thus tunes the RF transmission frequency of the RF generator 50. In an alternate embodiment, a separate tuned antenna may be connected to the second junction of the tank circuit.

Additional filtering components in the circuit include a grounded capacitor C4 connected to the input of the inverter array U2 and a grounded capacitor C6 connected to the output of the inverter array U2.

In operation: The positive voltage output from the voltage regulator U1 is connected the inverter array U2 and the RF choke inductor L1. The voltage drives the inverter array U2 to generate a square wave output, which is connected to the base of the BJT Q1 through resistor R3. When the square wave voltage is zero, the base of the BJT remains de-energized, and current does not flow through the inductor L1. When the square wave voltage is positive, the base of the BJT Q1 is energized through resistor R3. With the base of the BJT Q1 energized, current is allowed to flow across the base from the collector to the emitter and current is also allowed to flow across the inductor L1. When the square wave returns to a zero voltage, the base of the BJT Q1 is again de-energized.

When current flows across the choke inductor L1, the tank circuit capacitor C8 charges. Once the tank circuit capacitor C8 is charged, the tank circuit begins to resonate at the frequency determined by the circuit's LC constant. For example, a tank circuit having a 7 picofarad capacitor and an inductor L2 having a single rectangular loop measuring 0.7 inch by 0.3 inch, the resonant frequency of the tank circuit is 310 MHz. The choke inductor L1 prevents RF leakage into upstream components of the circuit (the inverter array U2) because changing the magnetic field of the choke inductor L1 produces an electric field opposing upstream current flow from the tank circuit. To produce an RF signal, charges have to oscillate with frequencies in the RF range. Thus, the charges oscillating in the tank circuit inductor/tuned loop antenna L2 produce an RF signal of preferably 310 Mhz. As the square wave output of the inverter turns the BJT Q1 on and off, the signal generated from the loop antenna 60 comprises a pulsed RF signal having a duration of 100 milliseconds and a pulse width of 0.5 milliseconds thus producing 100 pulses of 310 MHz. The RF generator section is tunable to multiple frequencies. Therefore, not only is the transmitter capable of a great number of unique codes, it is also capable of generating each of these codes at a different frequency, which greatly increases the number of possible combinations of unique frequency-code signals.

The RF generator 50 and antenna 60 work in conjunction with an RF receiver 70. More specifically, an RF receiver 70 in proximity to the RF transmitter 60 (within 150 feet) can receive the pulsed RF signal transmitted by the RF generator 50. The RF receiver comprises a receiving antenna 70 for intercepting the pulsed RF signal (tone). The tone generates a pulsed electrical signal in the receiving antenna 70 that is input to a microprocessor chip that acts as a decoder 80. The decoder 80 filters out all signals except for the RF signal it is programmed to receive, e.g., the signal generated by the RF generator 50. An external power source is also connected to the microprocessor chip/decoder 80. In response to the intercepted tone from the RF generator 50, the decoder chip produces a pulsed electrical signal. The external power source connected to the decoder 80 augments the pulsed voltage output signal developed by the chip. This augmented (e.g., 120VAC) voltage pulse is then applied to a conventional relay 90 for changing the position of a switch within the relay. Changing the relay switch position is then used to turn an electrical device with a bipolar switch on or off, or toggle between the several positions of a multiple position switch. Zero voltage switching elements may be added to ensure the relay 90 activates only once for each depression and recovery cycle of the flextensional transducer element 12 or electromagnetic actuator.

Switch Initiator System with Trainable Receiver

Several different RF transmitters may be used that generate different tones for controlling relays that are tuned to receive that tone. In another embodiment, digitized RF signals may be coded and programmable (as with a garage door opener) to only activate a relay that is coded with that digitized RF signal. In other words, the RF transmitter is capable of generating at least one tone, but is preferably capable of generating multiple tones. Most preferably, each transmitter is coded with one or more unique signals. This is easily done, since programmable ICs for generating the tone can have over $2^{30}$ possible unique signal codes which is the equivalent of over 1 billion codes. Most preferably the invention comprises a system of multiple transmitters and one or more receivers for actuating building lights and appliances. In this system for remote control of these devices, an extremely large number of codes are available for the transmitters for operating the lights and or appliances and each transmitter has at least one unique, permanent and nonuser changeable code. The receiver and controller module at the light or appliance is capable of storing and remembering a number of different codes corresponding to different transmitters such that the controller can be programmed so as to actuated by more than one transmitted code, thus allowing two or more transmitters to actuate the same light or appliance.

The remote control system includes a receiver/controller for learning a unique code of a remote transmitter to cause the performance of a function associated with the system, light or appliance with which the receiver/controller module is associated. The remote control system is advantageously used, in one embodiment, for interior or exterior lighting, household appliances or security system.

Preferably, a plurality of transmitters is provided wherein each transmitter has at least one unique and permanent non-user changeable code and wherein the receiver can be placed into a program mode wherein it will receive and store two or more codes corresponding to two or more different transmitters. The number of codes which can be stored in transmitters can be extremely high as, for example, greater than one billion codes. The receiver has a decoder module therein which is capable of learning many different transmitted codes, which eliminates code switches in the receiver and also provides for multiple transmitters for actuating the light or appliance. Thus, the invention makes it possible to eliminate the requirements for code selection switches in the transmitters and receivers.

Referring to FIG. 12: The receiver module 101 includes a suitable antenna 60 for receiving radio frequency transmissions from the transmitters 126 and 128 and supplies an input to a decoder 80 which provides an output to a microprocessor unit 144. The microprocessor unit 144 is connected to a relay device 90 or controller which switches the light or appliance between one of two or more operation modes, i.e., on, off, dim, or some other mode of operation. A switch 122 is mounted on a switch unit 119 connected to the receiver and also to the microprocessor 144. The switch 122 is a two position switch that can be moved between the "operate" and "program" positions to establish operate and program modes.

In the invention, each transmitter such as transmitters 26 and 28 will have at least one unique code which is determined by the tone generator/encoder chip 40 contained in the transmitter. The receiver unit 101 is able to memorize and store a number of different transmitter codes which eliminates the need of coding switches in either the transmitter or receiver which are used in the prior art. This also eliminates the requirement that the user match the transmitter and receiver code switches. Preferably, the receiver 101 is capable of receiving many transmitted codes, up to the available amount of memory locations 147 in the microprocessor 144, for example one hundred or more codes.

When the controller 90 for the light or appliance is initially installed, the switch 122 is moved to the program mode and the first transmitter 126 is energized so that the unique code of the transmitter 126 is transmitted. This is received by the receiver antenna 70 and decoded by the decoder 80 and supplied to the microprocessor unit 144. The code of the transmitter 126 is then supplied to the memory address storage 147 and stored therein. Then if the switch 122 is moved to the operate mode and the transmitter 126 energized, the receiver 70, decoder 80 and the microprocessor 144 will compare the received code with the code of the transmitter 126 stored in the first memory location in the memory address storage 147 and since the stored memory address for the transmitter 126 coincides with the transmitted code of the transmitter 126 the microprocessor 144 will energize the controller mechanism 90 for the light or appliance to energize de-energize or otherwise operate the device.

In order to store the code of the second transmitter 128 the switch 122 is moved again to the program mode and the transmitter 28 is energized. This causes the receiver 70 and decoder 80 to decode the transmitted signal and supply it to the microprocessor 144 which then supplies the coded signal of the transmitter 128 to the memory address storage 147 where it is stored in a second address storage location. Then the switch 122 is moved to the operate position and when either of the transmitters 126 and 128 are energized, the receiver 70 decoder 80 and microprocessor 144 will energize the controller mechanism 90 for the light or appliance to energize de-energize or otherwise operate the device.

Thus, the codes of the transmitters 126 and 128 are transmitted and stored in the memory address storage 147 during the program mode after which the light or appliance controller will respond to either of the transmitters 126 and 128. Any desired number of transmitters can be programmed to operate the light or appliance up to the available memory locations in the memory address storage 147.

This invention eliminates the requirement that binary switches be set in the transmitter or receiver as is done in systems of the prior art. The invention also allows a controller to respond to a number of different transmitters because the specific codes of a number of the transmitters are stored and retained in the memory address storage 147 of the receiver module 101.

In yet another more specific embodiment of the invention, each transmitter 126 or 128 contains two or more unique codes for controlling an appliance. One code corresponds in the microprocessor to the "on" position and another code corresponds in the microprocessor 144 to the "off" position of the controller. Alternately, the codes may correspond to "more" or "less" respectively in order to raise or lower the volume of a sound device or to dim or medium lighting for example. Lastly, the unique codes in a transmitter 126 or 128 may comprise four codes which the microprocessor interprets as "on", "off", "more" and "less" positions of the controller 90, depend on the desired setup of the switches. Alternatively, a transmitter may only have two codes, but the microprocessor 144 interprets repeated pushes of "on" or "off" signals respectively to be interpreted as dim up and down.

In another embodiment of the invention, receivers may be trained to accept the transmitter code(s) in one-step. Basically, the memory 147 in the microprocessor 144 of the receiver modules 101 will have "slots" where codes can be stored. For instance one slot may be for all of the codes that the memory 147 accepts to be turned on, another slot for all the off codes, another all the 30% dimmed codes, etc.

Each transmitter 126 will have a certain set of codes, maybe just one, the "toggle" code, wherein the receiver module 101 knows only to reverse its current state, if it's on, turn off, and if it's off, turn on. But, the transmitter 126 may have many codes as listed above, and many more codes for the complex control of appliances. Each of these codes is "unique". The transmitter 126 will send out its code set in a way in which the receiver 101 knows in which slots to put each code. Also, with the increased and longer pulse of electricity that can be generated in the transmitter 126, a single transmission of a code set is doable even with mechanically produced voltage. As a back-up, if this is not true, and if wireless transmission uses up more electricity than we have available, some sort of temporary wired connection (jumper not shown) between each transmitter and receiver target is possible. Although the disclosed embodiment shows manual or mechanical interaction with the transmitter and receiver to train the receiver, it is yet desirable to put the receiver in reprogram mode with a wireless transmission, for example a "training" code.

In yet another embodiment of the invention, the transmitter 126 may have multiple unique codes and the transmitter randomly selects one of the multitude of possible codes, all of which are programmed into the memory allocation spaces 147 of the microprocessor 144.

In yet another embodiment of the invention, the transmitter 126 signal need not be manually operated or triggered, but may as easily be operated by any manner of mechanical force, i.e., the movement of a window, door, safe, foot sensor, etc. and that a burglar alarm sensor might simultaneously send a signal to the security system and a light in the intruded upon room. Likewise, the transmitter 126 may be combined with other apparatus. For example, a transmitter 126 may be located within a garage door opener which can also turn on one or more lights in the house, when the garage door opens.

Furthermore, the transmitters can talk to a central system or repeater which re-transmits the signals by wire or wireless means to lights and appliances. In this manner, one can have one transmitter/receiver set, or many transmitters interacting with many different receivers, some transmitters talking to one or more receivers and some receivers being controlled by one or more transmitters, thus providing a broad system of interacting systems and wireless transmitters. Also, the transmitters and receivers may have the capacity of interfacing with wired communications like SMARTHOME or BLUETOOTH.

While in the preferred embodiment of the invention, the actuation means has been described as from mechnical to electric, it is within the scope of the invention to include batteries in the transmitter to power or supplement the power of the transmitter. For example, rechargeable batteries may be included in the transmitter circuitry and may be recharged through the electromechanical actuators. These rechargeable batteries may thus provide backup power to the transmitter.

It is seen that the present invention allows a receiving system to respond to one of a plurality of transmitters which have different unique codes which can be stored in the receiver during a program mode. Each time the "program mode switch" 122 is moved to the program position, a different storage can be connected so that the new transmitter code would be stored in that address. After all of the address storage capacity have been used additional codes would erase all old codes in the memory address storage before storing a new one.

This invention is safe because it eliminates the need for 120 VAC (220 VAC in Europe) lines to be run to each switch in the house. Instead the higher voltage overhead AC lines are only run to the appliances or lights, and they are actuated through the self-powered switching device and relay switch. The invention also saves on initial and renovation construction costs associated with cutting holes and running the electrical lines to/through each switch and within the walls. The invention is particularly useful in historic structures undergoing preservation, as the walls of the structure need not be destroyed and then rebuilt. The invention is also useful in concrete construction, such as structures using concrete slab and/or stucco construction and eliminate the need to have wiring on the surface of the walls and floors of these structures.

While the above description contains many specificities, these should not be construed as limitations on the scope of the invention, but rather as an exemplification of one preferred embodiment thereof. Many other variations are possible, for example:

In addition to piezoelectric devices, the electroactive elements may comprise magnetostrictive or ferroelectric devices;

Rather than being arcuate in shape, the actuators may normally be flat and still be deformable;

Multiple high deformation piezoelectric actuators may be placed, stacked and/or bonded on top of each other;

Multiple piezoelectric actuators may be placed adjacent each other to form an array.

Larger or different shapes of THUNDER elements may also be used to generate higher impulses.

The piezoelectric elements may be flextensional actuators or direct mode piezoelectric actuators.

A bearing material may be disposed between the actuators and the recesses or switch plate in order to reduce friction and wearing of one element against the next or against the frame member of the switch plate.

Other means for applying pressure to the actuator may be used including simple application of manual pressure, rollers, pressure plates, toggles, hinges, knobs, sliders, twisting mechanisms, release latches, spring loaded devices, foot pedals, game consoles, traffic activation and seat activated devices.

Accordingly, the scope of the invention should be determined not by the embodiment illustrated, but by the appended claims and their legal equivalents.

We claim:

1. A self-powered switching system comprising:
    a flextensional transducer, said flextensional transducer comprising;
        a first electroactive member having opposing first and second electroded major faces;
        said first opposing major face being substantially convex and said second opposing major face being substantially concave;
        a prestress layer bonded to said second major face of said first electroactive member;
        said prestress layer applying a compressive force to said electroactive member;
        wherein said flextensional transducer is adapted to deform from a first position to a second position upon application of a force to said flextensional transducer;
        and wherein upon said deformation to said second position, said flextensional transducer is adapted to generate a first voltage potential between said first electroded major face and said second electroded major face;
    a first conductor electrically connected to said first electroded major face of said first electroactive member;
    a second conductor electrically connected to said second electroded major face of said first electroactive member;
    first signal transmission means electrically connected to said first and second conductors;
        said first signal transmission means comprising a first radio frequency generator subcircuit connected to an antenna;
    signal reception means for receiving a first signal transmitted by said first signal transmission means;
        said signal reception means being adapted to generate a second signal in response to said first signal transmitted by said signal transmission means; and
    a switch having a first position and a second position;
        said switch being in communication with said signal reception means;
        said switch being adapted to change between said first position and said second position in response to said second signal.

2. The switching system according to claim 1, further comprising:
    pressure application means for application of a force to said flextensional transducer, said pressure application means being adapted to apply a force sufficient to deform said flextensional transducer from said first position to said second position, thereby generating said first voltage potential.

3. The switching system according to claim 1, further comprising:
    a voltage regulator having an input side and an output side;
        said input side of said voltage regulator being electrically connected to said first and second conductors;
        said output side of said voltage regulator being electrically connected to said signal transmission means.

4. The switching system according to claim 3, further comprising:
    a diode having an anode and a cathode connected in parallel with said flextensional;
        said cathode of said diode being electrically connected to said first conductor and said input side of said voltage regulator;
        said anode of said diode being electrically connected to said second conductor and said input side of said voltage regulator;
        whereby said diode is connected in parallel with first and second electroded major faces of said first electroactive member.

5. The switching system according to claim 4, wherein said signal transmission means further comprises:
- a tone generator subcircuit having an input side and an output side;
  - said input side of said tone generator subcircuit being connected to said output side of said voltage regulator;
  - said output side of said tone generator subcircuit being connected to said first radio frequency generator subcircuit.

6. The switching system according to claim 5, wherein said tone generator subcircuit comprises:
- an oscillator array having an input side and an output side;
  - said input side of said oscillator array being connected to said output side of said voltage regulator; and
- a transistor having a grounded emitter and a base connected to said output side of said oscillator array;
- and wherein said first radio frequency generator subcircuit comprises a resonant subcircuit having a first and a second junction;
  - said first junction of said resonant subcircuit being connected to said voltage regulator;
  - said second junction of said resonant subcircuit being connected to a collector of said transistor.

7. The switching system according to claim 6, wherein said first radio frequency generator subcircuit further comprises:
- a radio frequency choke connected in series between said output side of said voltage regulator and said first junction of said resonant subcircuit.

8. The switching device according to claim 7, wherein said resonant subcircuit comprises:
- a first capacitor having a first and a second plate; and
- an inductive loop of a third conductor having first and second ends;
  - said first plate of said first capacitor being connected to said first end of said fifth conductor, thereby forming said first junction of said resonant subcircuit;
  - said second plate of said first capacitor being connected to said second end of said fifth conductor, thereby forming said second junction of said resonant subcircuit.

9. The switching system according to claim 8, wherein said oscillator array further comprises an inverter array connected between said output side of said voltage regulator and said base of said transistor.

10. The switching system according to claim 9, wherein said radio frequency choke comprises an inductor.

11. The switching system according to claim 10, wherein said resonant subcircuit further comprises:
- a tuning jumper comprising a sixth conductor having first and second ends each connected to said fifth conductor; said tuning jumper being adapted to pivot at said first and second ends, thereby rotating relative to said fifth conductor.

12. The switching system according to claim 11, wherein said first radio frequency generator subcircuit is tunable to a first frequency different from a second frequency of second radio frequency generator subcircuit.

13. The switching device according to claim 12, wherein said signal reception means further comprises:
- a first radio signal receiver for intercepting said first signal transmitted by said first radio frequency generator subcircuit and a second signal transmitted by said second radio frequency generator subcircuit; and
- decoding means electrically connected between said radio signal receiver and said switch for generating a switching signal in response to said first and second intercepted signals.

14. The switching device according to claim 13, wherein said decoding means further comprises:
- a memory for storage of one or more signal profiles; and
- comparator means for determining whether said first or second intercepted signal matches said one or more signal profiles in said memory;
- wherein said decoding means generates a switching signal in response to said first intercepted signal upon said comparator means determination that said first intercepted signal matches said one or more signal profiles in said memory;
- and wherein said decoding means does not generate a switching signal in response to said second intercepted signal upon said comparator means determination that said second intercepted signal does not match any of said one or more signal profiles in said memory;
- and wherein said switch is adapted to change from said first position to said second position in response to said switching signal generated by said decoding means.

15. The switching system according to claim 14, wherein said decoder means comprises:
- a microprocessor for differentiating between said first intercepted signal and said second intercepted signal.

16. The switching system according to claim 15, wherein said decoder means further comprises:
- storage means for entering one or more signal profiles into said memory.

17. The switching system according to claim 16, wherein said storage means further comprises:
- a second radio signal receiver for intercepting a third signal transmitted by a third radio frequency generator subcircuit.

* * * * *